(12) United States Patent
Chaparala et al.

(10) Patent No.: US 11,591,257 B2
(45) Date of Patent: Feb. 28, 2023

(54) MULTI-LAYER STRUCTURE AND METHOD OF MAKING SAME

(71) Applicant: CORNING INCORPORATED, Corning, NY (US)

(72) Inventors: Satish Chandra Chaparala, Cupertino, CA (US); Kristen Lorraine Eckart, Corning, NY (US); Kurt Edward Gerber, Dansville, NY (US); Ming-Huang Huang, Ithaca, NY (US); Nagaraja Shashidhar, Painted Post, NY (US); Huan-Hung Sheng, Horseheads, NY (US); Michael Lesley Sorensen, Waverly, NY (US); Ananthanarayanan Subramanian, Corning, NY (US)

(73) Assignee: Corning Incorporated, Corning, NY (US)

( * ) Notice: Subject to any disclaimer, the term of this patent is extended or adjusted under 35 U.S.C. 154(b) by 444 days.

(21) Appl. No.: 16/500,997

(22) PCT Filed: Apr. 4, 2018

(86) PCT No.: PCT/US2018/025975
§ 371 (c)(1),
(2) Date: Oct. 4, 2019

(87) PCT Pub. No.: WO2018/187391
PCT Pub. Date: Oct. 11, 2018

(65) Prior Publication Data
US 2020/0031710 A1    Jan. 30, 2020

Related U.S. Application Data

(60) Provisional application No. 62/481,387, filed on Apr. 4, 2017.

(51) Int. Cl.
*C03C 21/00* (2006.01)
*B32B 17/10* (2006.01)
(Continued)

(52) U.S. Cl.
CPC ............... *C03C 15/00* (2013.01); *B32B 7/12* (2013.01); *B32B 17/10064* (2013.01);
(Continued)

(58) Field of Classification Search
None
See application file for complete search history.

(56) References Cited

U.S. PATENT DOCUMENTS

| 5,963,679 A | 10/1999 | Setlak |
| 6,069,970 A | 5/2000 | Salatino et al. |

(Continued)

FOREIGN PATENT DOCUMENTS

| JP | 2016-533316 A | 10/2016 |
| JP | 2016-538233 A | 12/2016 |

(Continued)

OTHER PUBLICATIONS

Dielectric Constants at 20° C.; https://web.archive.org/web/20111219025811/http://hyperphysics.phy-astr.gsu.edu/hbase/Tables/diel.html (Year: 2011).*

(Continued)

*Primary Examiner* — David Sample
(74) *Attorney, Agent, or Firm* — Russell S. Magaziner; John P. McGroarty; Jeffrey A. Schmidt

(57) ABSTRACT

A multi-layer and method of making the same are provided. The multi-layer, such as a sensor, can include a high strength glass overlay and a lamination layer on a substrate layer. The overlay can be less than 250 micrometers thick and have at least one tempered surface incorporating a surface compression layer of at least 5 micrometers deep and a surface
(Continued)

compressive stress of at least 200 MPa. The overlay can exhibit a puncture factor of at least 3000 N/μm² at B10 ($10^{th}$ percentile of the probability distribution of failure) in a multi-layer structure, an apparent thickness of less than 0.014 mm, and a pencil hardness greater than 6H. The method can include ion-exchange tempering at least one major surface of a glass sheet, light etching the major surface to remove flaws and laminating the glass sheet on the tempered and lightly etched major surface to a substrate layer.

19 Claims, 16 Drawing Sheets

(51) Int. Cl.

| | | |
|---|---|---|
| *B32B 37/12* | (2006.01) | |
| *B32B 37/18* | (2006.01) | |
| *C03C 15/00* | (2006.01) | |
| *C03C 27/10* | (2006.01) | |
| *H05K 1/02* | (2006.01) | |
| *B32B 7/12* | (2006.01) | |
| *H05K 5/00* | (2006.01) | |
| *H05K 5/03* | (2006.01) | |

(52) U.S. Cl.
CPC .. *B32B 17/10137* (2013.01); *B32B 17/10146* (2013.01); *B32B 17/10899* (2013.01); *B32B 37/12* (2013.01); *B32B 37/182* (2013.01); *C03C 21/002* (2013.01); *C03C 27/10* (2013.01); *H05K 1/0296* (2013.01); *B32B 2307/202* (2013.01); *B32B 2307/204* (2013.01); *B32B 2307/412* (2013.01); *B32B 2307/558* (2013.01); *B32B 2315/08* (2013.01); *B32B 2457/20* (2013.01); *H05K 5/0017* (2013.01); *H05K 5/03* (2013.01); *H05K 2201/017* (2013.01); *H05K 2201/0195* (2013.01)

(56) References Cited

U.S. PATENT DOCUMENTS

| | | | |
|---|---|---|---|
| 7,251,351 B2 | 7/2007 | Mathiassen et al. | |
| 8,547,402 B2 | 10/2013 | Kreeger et al. | |
| 8,889,254 B2 | 11/2014 | Bayne et al. | |
| 9,315,108 B2 | 4/2016 | Yokoyama et al. | |
| 9,516,149 B2 | 12/2016 | Wright et al. | |
| 10,273,184 B2 | 4/2019 | Garner et al. | |
| 2013/0059157 A1 | 3/2013 | Bookbinder et al. | |
| 2014/0042406 A1* | 2/2014 | Degner | H05K 1/028 257/40 |
| 2014/0216914 A1 | 8/2014 | Pope et al. | |
| 2015/0064374 A1 | 3/2015 | Jain et al. | |
| 2015/0079398 A1 | 3/2015 | Amin et al. | |
| 2015/0210589 A1 | 7/2015 | Chang et al. | |
| 2015/0277502 A1 | 10/2015 | Witham et al. | |
| 2016/0107928 A1 | 4/2016 | Bayne et al. | |
| 2016/0124534 A1* | 5/2016 | Ahn | B32B 17/10146 345/173 |
| 2016/0214889 A1 | 7/2016 | Garner et al. | |
| 2017/0022092 A1 | 1/2017 | DeMartino et al. | |
| 2017/0050878 A1 | 2/2017 | Mauro et al. | |
| 2017/0336831 A1* | 11/2017 | Zhang | G06F 3/0446 |
| 2019/0047900 A1* | 2/2019 | Hu | C03C 17/28 |

FOREIGN PATENT DOCUMENTS

| | | |
|---|---|---|
| JP | 2016-539067 A | 12/2016 |
| KR | 10-0855416 B1 | 8/2008 |
| KR | 10-2015-0036443 A | 4/2015 |
| KR | 10-2016-0061326 A | 5/2016 |
| WO | 2016/006020 A1 | 1/2016 |
| WO | 2016/073549 A1 | 5/2016 |
| WO | 2016073551 A1 | 5/2016 |
| WO | 2016154901 A1 | 10/2016 |
| WO | 2016196546 A1 | 12/2016 |
| WO | 2017/026267 A1 | 2/2017 |
| WO | 2017/066364 A1 | 4/2017 |
| WO | 2017/123899 A1 | 7/2017 |
| WO | 2017/160680 A1 | 9/2017 |

OTHER PUBLICATIONS

European Patent Application No. 18780636.9 Supplementary European search report and Search Opinion dated Dec. 9, 2020; 16 pages; European Patent Office.
Chai et al; "Fracture Modes in Brittle Coatings With Large Interlayer Modulus Mismatch"; J. Mater. Res., vol. 14, No. 9 (1999) pp. 3805-3817.
Chai et al; "Role of Adhesive Interlayer in Transverse Fracture of Brittle Layer Structures" J. Mater. Res., vol. 15, No. 4, (2000); pp. 1017-1024.
Dolcourt; "Sapphire Phone Screens Not as Strong as You Think, Says Corning"; 2013; 4 Pages; www.cnet.com/news/sapphire-phone-screens-not-as-strong-as-you-think-says-corning/.
International Search Report and Written Opinion of the International Searching Authority; PCT/US2018/025975; dated Jun. 8, 2018; 13 Pages; ISA/US Commissioner for Patents.
Xue et al; "An Experimental and Numberical Study of the Dynamic Fracture of Glass"; Proceedings of the ASME 2013 International Technical Conference and Exhibition on Packaging and Integration of Electronic and Photonic Microsystems; 2013; 9 Pages.
Korean Patent Application No. 10-2019-7032384, Office Action, dated Jan. 27, 2022, 14 pages (4 pages of English Translation and 10 pages of Original Document), Korean Patent Office.
Japanese Patent Application No. 2019-554817, Office Action, dated Apr. 6, 2022, 12 pages (06 pages of English Translation and 06 pages of Original Copy); Japanese Patent Office.

* cited by examiner

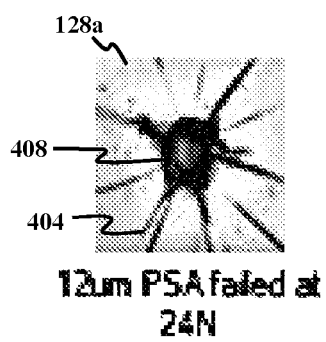
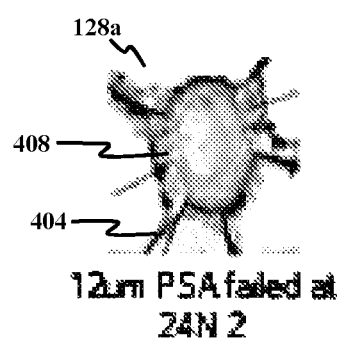
FIG. 4B
FIG. 4C

MULTI-LAYER STRUCTURE AND METHOD OF MAKING SAME

This application is a national stage entry of International Patent Application Serial No. PCT/US2018/025975 filed on Apr. 4, 2018, which claims the benefit of priority of U.S. Provisional Application Ser. No. 62/481,387 filed on Apr. 4, 2017 the contents of which are relied upon and incorporated herein by reference in their entirety as if fully set forth below.

BACKGROUND

Field

Exemplary embodiments of the present disclosure relate to a multi-layer structure and method of making same. More particularly, exemplary embodiments of the present disclosure relate to a high strength, ultra-thin glass sheet in a multi-layer structure, a protective glass system including a glass overlay of a glass material, and a method of manufacturing a multi-layer structure having a high strength, ultra-thin glass sheet.

Discussion of the Background

Covers for electrical devices such as displays having sensors may be used in a variety of devices. Generally, properties or factors to consider in selecting a cover material may include thickness, dielectric constant, cost, and durability. For instance, a sensor cover may decrease a signal-to-noise ratio to an undesirable or unacceptable level. Many covers may be made of thick polymer material, such as shown in FIG. 1, or an expensive material, such as sapphire. Polymeric overlays may be damaged quickly in-service, inhibit the signal, and may provide false readings, whereas sapphire may be too expensive.

FIG. 1 is a schematic diagram of a sensor 12 having conductors 16 disposed on a substrate layer 20 and a base layer 24 covered with about 10 micrometers of polymer 28, on which a 40 to 50 micrometer layer of polymer-based color and hard coating 32 is disposed. A low overall thickness of the cover may be desirable, since the sensitivity of the sensor 12 as measured by a signal-to-noise ratio (SNR) can be highly dependent on the cover thickness. The SNR decreases approximately 0.7 dB per micrometer of the coating stack of the cover. The conventional approach for a cover has been to apply a thick polymer based coating as shown in FIG. 1 where the sensor array may be covered by about 60 micrometer thick polymeric coating. The polymeric coating may comprise one or more layers.

The above information disclosed in this Background section is only for enhancement of understanding of the background of the disclosure and therefore it may contain information that does not form any part of the prior art nor what the prior art may suggest to a person of ordinary skill in the art.

SUMMARY

Exemplary embodiments of the present disclosure provide a multi-layer structure having a cover of an ultra-thin and high puncture resistant glass sheet.

Exemplary embodiments of the present disclosure also provide a protective glass system.

Exemplary embodiments of the present disclosure also provide a method of manufacturing a multi-layer structure having a cover of an ultra-thin and high puncture resistant glass sheet.

Additional features of the disclosure will be set forth in the description which follows, and in part will be apparent from the description, or may be learned by practice of the disclosure.

An exemplary embodiment discloses a multi-layer structure, comprising a glass sheet, a lamination layer, and a substrate layer, where the glass sheet and the substrate layer are laminated together via the lamination layer. The glass sheet is less than 250 micrometers thick, and the glass sheet comprises first and second tempered surfaces, wherein at least the first tempered surface incorporates a surface compression layer having a depth of at least 5 micrometers and a surface compressive stress of at least 200 MPa. A puncture factor, Pf, of the glass sheet in the multi-layer structure is at least 3000 N/mm$^2$ at B10 ($10^{th}$ percentile of the probability distribution of failure). The puncture factor is the ratio of the puncture load at failure to the thickness squared of the glass sheet. Here, the puncture factor is measured by a 1.5 mm diameter spherical segment tip centered over the at least one tempered surface of the glass sheet, and linearly increasing load at a rate of about 30 Newton per second.

Another exemplary embodiment discloses a protective glass system. The protective glass system includes a glass overlay of a glass material and an underlay comprising a stack of layers. The glass overlay includes first and second major surfaces that face away from one another, and a thickness of less than 250 micrometers between the first and second major surfaces. The glass overlay is strengthened on at least the first major surface, the compressive stress at the first major surface is at least 200 MPa, and the compressive stress extends inward from the first major surface to a depth of layer that is at least 5 micrometers. A first layer of the underlay has a low modulus of elasticity, that being less than 5 GPa, to cushion the glass overlay, and a second layer of the underlay is stiff, having a modulus of elasticity at least five times the modulus of elasticity of the first layer. The first layer of the underlay is between the glass overlay and the second layer of the underlay, and the first layer has a thickness between the glass overlay and the second layer that is 200 micrometers or less, whereby excessive deflection of the glass overlay into the first layer of the underlay is inhibited by the second layer of the underlay.

Another exemplary embodiment discloses a method of manufacturing a multi-layer structure. The method comprises ion-exchange tempering at least one major surface of a glass sheet, light etching the at least one major surface after ion-exchange tempering to remove surface flaws, disposing a laminate layer on one of the at least one tempered and light etched surface, and disposing a substrate layer on the laminate layer to laminate the glass sheet and the substrate layer together. A puncture factor, Pf, of the glass sheet in the multi-layer structure is at least 3000 N/mm$^2$ at B10 ($10^{th}$ percentile of the probability distribution of failure). The puncture factor is the ratio of the puncture load at failure to the thickness squared of the glass sheet, and puncture factor is measured by a 1.5 mm diameter spherical segment tip centered over the at least one major surface of the glass sheet, and linearly increasing load at a rate of about 30 Newton per second.

It is to be understood that both the foregoing general description and the following detailed description are exemplary and explanatory and are intended to provide further explanation of the disclosure.

BRIEF DESCRIPTION OF THE DRAWINGS

The accompanying drawings, which are included to provide a further understanding of the disclosure and are incorporated in and constitute a part of this specification, illustrate exemplary embodiments of the disclosure, and together with the description serve to explain the principles of the disclosure.

FIGS. 4B and 4C show fracture macrographs at two magnifications of a thin glass sheet specimen after an example mechanical puncture test.

DETAILED DESCRIPTION OF THE ILLUSTRATED EMBODIMENTS

Figure 1:
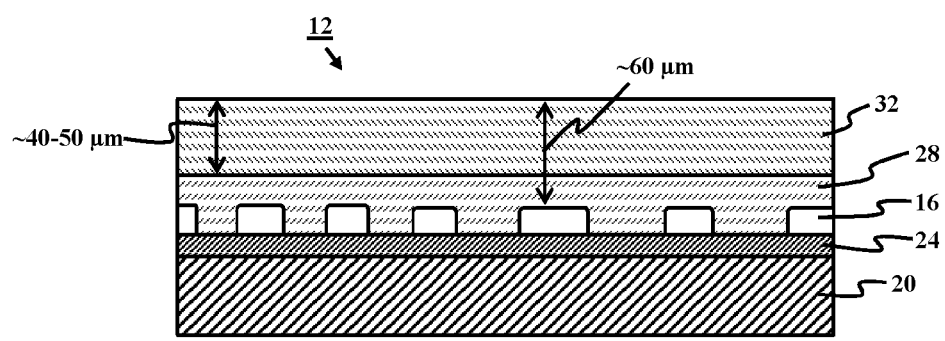
FIG. 1 is a schematic diagram of a multi-layer structure including a polymer layer conventional sensor cover.

The disclosure is described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure is thorough, and will fully convey the scope of the disclosure to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Exemplary embodiments of the present disclosure relate to a multi-layer structure and method of making same. More particularly, exemplary embodiments of the present disclosure relate to a high strength, ultra-thin glass sheet in a multi-layer structure, a protective glass system including a glass overlay of a glass material, and a method of manufacturing a multi-layer structure having a high strength, ultra-thin glass sheet.

Figure 2:
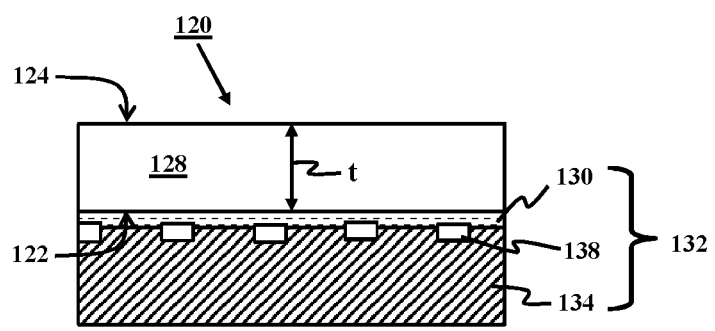
FIG. 2 is a schematic diagram of a multi-layer structure including a thin glass sheet according to an exemplary embodiment of the disclosure.

As illustrated in FIG. 2 a multi-layer structure 120, comprising a glass sheet 128, a lamination layer 130, and a substrate layer 134, where the glass sheet 128 and the substrate layer 134 are laminated together via the lamination layer 130 can be provided according to an exemplary embodiment. The lamination layer 130 can be optically transparent. The lamination layer 130 can comprise a modulus of elasticity less than 9 GPa, for example, less than 7 GPa, less than 5 GPa, or even less than 3 GPa. The lamination layer 130 can be less than about 20 µm thick, for example, less than 10 µm thick, less than 5 µm thick, even less than 1 µm thick. For example, the laminate layer 130 can be applied by adsorption and be a monolayer of molecules.

The substrate layer 134 can have a modulus of elasticity of greater than 25 GPa. For example, the substrate layer 134 can have a modulus of elasticity of greater than 40 GPa, for example, greater than 50 GPa, greater than 60 GPa, greater than 70 GPa, or even greater than 80 GPa. In the embodiments, the substrate layer 134 may have a modulus of elasticity of greater than five times the modulus of elasticity of the laminate layer 130. The substrate layer 134 can comprise a glass layer. Further an electronic componentry layer 138 comprising electrically conductive pathways can be disposed between the glass sheet and the substrate layer 134, for example, on the substrate layer 134.

The glass sheet 128 can be ultra-thin, for example, less than 250 μm thick, for example, less than 200 μm thick, less than 150 μm thick, less than 100 μm thick, less than 70 μm thick, or even less than 50 μm thick. The glass sheet 128 can include a first tempered surface 122 and a second tempered surface 124. At least the first tempered surface 122 incorporates a surface compression layer having a depth of at least 5 micrometers and a surface compressive stress of at least 200 MPa, as described further below. For example, the surface compressive stress can be at least 200 MPa, but no greater than 800 MPa, and a depth of layer (DOL) can be in a range between about 5 microns and about 30 microns, for example, the DOL can be in a range between about 10 microns and about 30 microns, or even in a range between about 10 microns and about 20 microns. The glass sheet 128 can be an ultra-thin glass, such as a cover glass, a glass overlay and the like. When the glass sheet is ultra-thin, for example, less than 70 μm thick or less than 50 μm thick, a DOL of 30 μm may be difficult to achieve, in such instances of ultra-thin glass, the DOL may be up to 20% of the ultra-thin glass sheet thickness instead.

A puncture factor, Pf, of the glass sheet 128 in the multi-layer structure 120 can be at least 3000 N/mm$^2$ at B10 ($10^{th}$ percentile of the probability distribution of failure). The puncture factor is the ratio of the puncture load at failure to the thickness t squared of the glass sheet 128, Pf=P/t$^2$. Here, the puncture factor is measured by a 1.5 mm diameter spherical segment tip centered over the at least one tempered surface of the glass sheet 128, under a linearly increasing load at a rate of about 30 Newton per second, which is 200 Newton per minute. When the laminate layer 130 is less than 10 μm thick, the puncture factor can be much greater than 3000 N/mm$^2$ at B10.

Figure 3A:
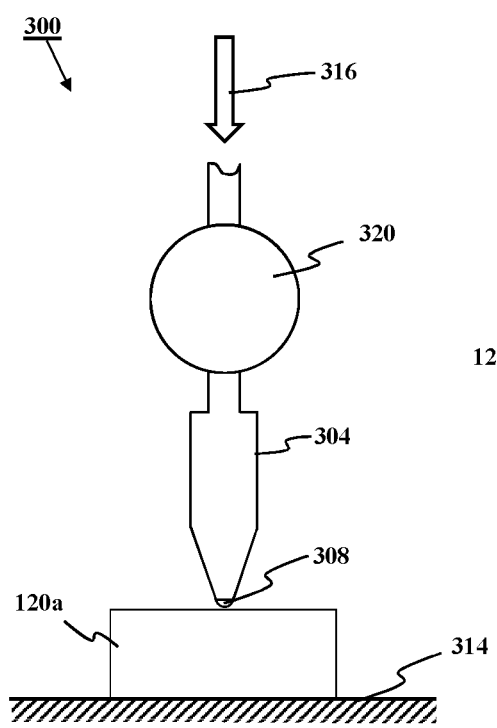
FIG. 3A is a schematic diagram of a mechanical puncture test according to an exemplary embodiment of the disclosure.
Figure 3B:
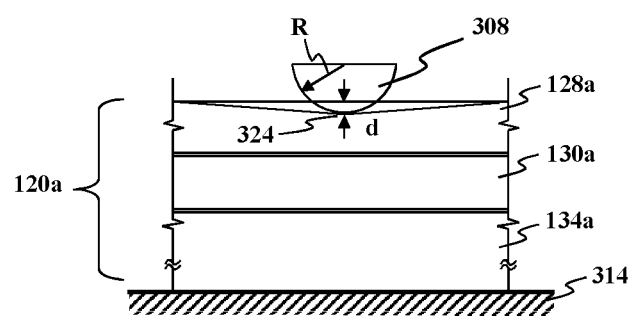
FIG. 3B is schematic diagram of a multi-layer structure including a thin glass sheet in a puncture test according to an embodiment of the disclosure.

FIG. 3A is a schematic diagram of a mechanical puncture test apparatus 300 according to an exemplary embodiment. The behavior of ultra-thin glass 128a that is placed over a low-modulus structure, such as laminate layer 130a and a substrate layer, such as substrate layer 134a can be characterized by ball drop tests, accelerated surface damage tests, drop tests, and puncture tests. The ball drop tests can test the surface strength of the ultra-thin glass overlay 128a. The accelerated surface damage tests can replicate surface scratch events of the ultra-thin glass overlay 128a roughly equivalent to a year of cumulative in-service damage in about 45 minutes. The drop tests can simulate sharp contact damage of the ultra-thin glass overlay 128a for drop events on various surfaces such as granite and asphalt. The puncture test can also test the surface strength of the ultra-thin glass overlay 128a and may be considered a more controlled test to study material properties compared to a ball drop test. In FIG. 3 a confocal pen 304 can perform precision displacement measurements when an indenter comprising a spherical segment tip 308 thereof is pressed into a multi-layer specimen 120a on support 314 by force 316. The load can be measured by load cell 320. The indenter spherical segment tip 308 can comprise a ball having a diameter of about 1.5 mm. A sufficiently fast loading rate can be selected to prevent fatigue during the loading event. The loading rate can be selected based on an appropriate load cell 320 with a sufficient maximum load rating for testing and applying that maximum load rating value over a one minute time interval.

The puncture test can include loading the ultra-thin glass overlay specimen 128a such that it displaces under the spherical segment tip 308 a distance "d" to failure 324 and unload, for example, loading and unloading at a rate corresponding to the maximum load cell rating per minute. The depth "d" where the glass 128a fractures 324 corresponds to a sudden increase in depth that can be determined by the confocal pen 304. The load at the fracture event 324 is the puncture load.

Figure 4A:
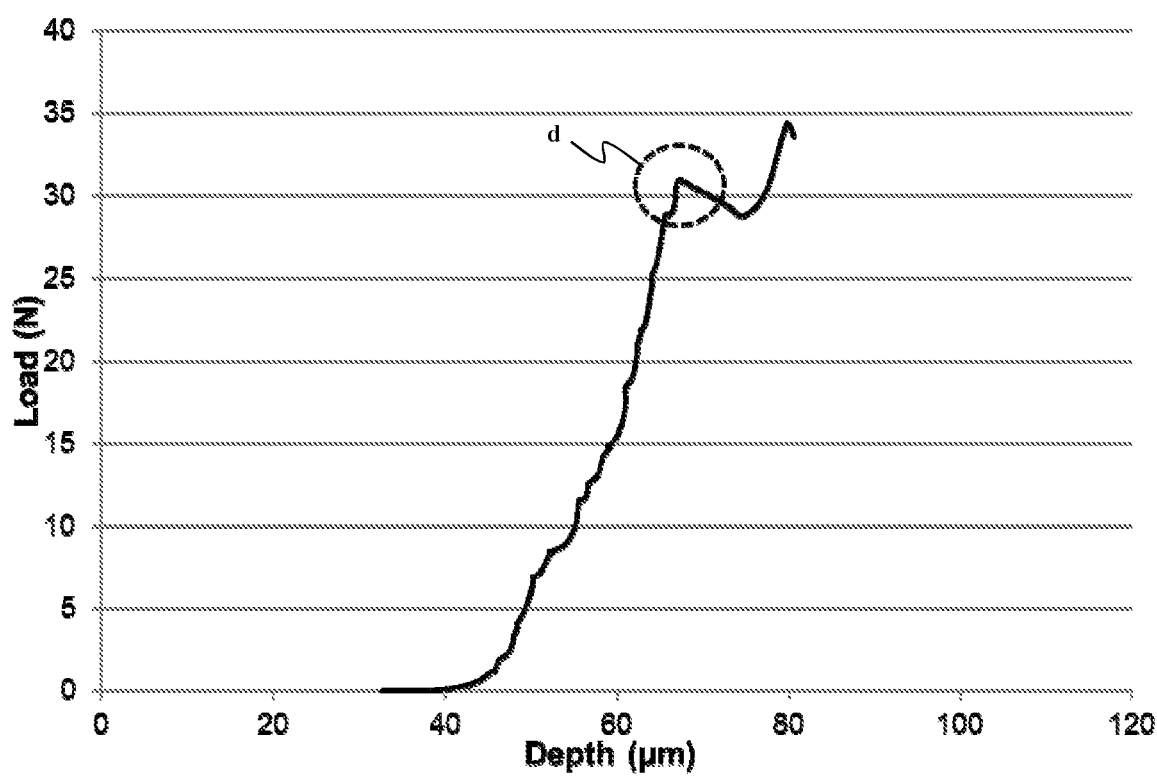
FIG. 4A presents an example of a load (N) versus displacement depth (in micrometers, hereinafter also referred to as "micrometer", "microns", "micron", and "µm") data curve for a mechanical puncture test of a thin glass sheet according to an exemplary embodiment of the disclosure.

FIG. 4A presents an example of a load (N) versus displacement depth (μm) data curve for a mechanical puncture test of the ultra-thin glass sheet 128a in a multi-layer specimen 120b. The sample in FIG. 4A was loaded to 200 N at a loading rate of 200 N/min (30 N/s) and an unloading rate of 200 N/min with a contact load of 1000 mN. The depth "d" and load at the sudden increase in depth can be clearly observed in the graph. FIGS. 4B and 4C show fracture 324 macrographs at two magnifications of a thin glass sheet specimen 128a after an example mechanical puncture test. Fractures 404 and a conical indentation 408 corresponding to the indenter segment tip 308 shape are illustrated in the macrographs.

The second tempered surface 124 of the glass sheet 128, 128a in the multi-layer structure 120, 120a can incorporate a surface compression layer having a depth of at least 10 micrometers and a surface compressive stress of at least 200 MPa, and the second tempered surface compression layer depth can be less than the first tempered surface 122 compression layer depth.

Figure 5A:
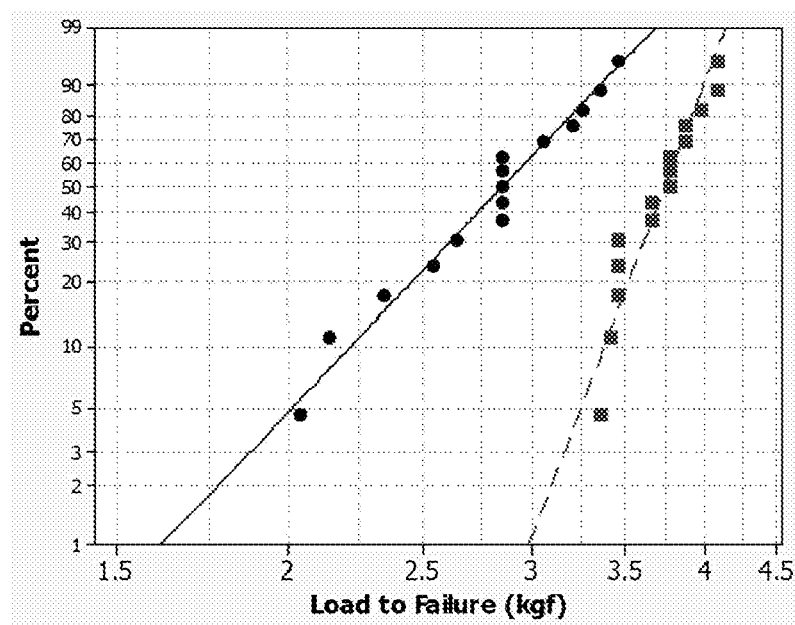
FIG. 5A illustrates graphical results of mechanical puncture testing data before and after process to remove submicron flaws according to an exemplary embodiment of the disclosure.
Figure 5B:
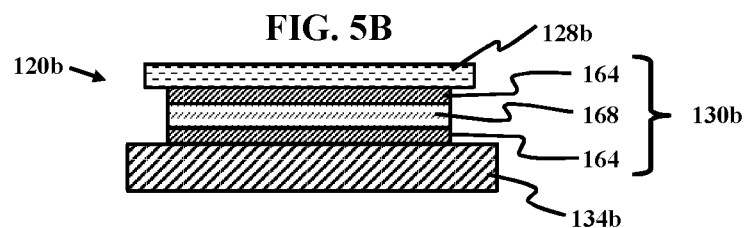
FIG. 5B is a schematic side view of the thin glass cover on a cushion layer used in the mechanical puncture test according to an exemplary embodiment.

The thin glass sheet 128, 128a of glass material less than 0.2 mm thick disposed on a low modulus multi-layer structure, such as the laminate layer 130, 130a, can withstand high loads during a puncture event as described. An improvement can be achieved over standard materials by removing submicron flaws on the first surface 122 of the thin glass sheet 128, 128a allowing the glass material to withstand even higher puncture loads. For example, a greater than 50% increase in strength over non-treated samples, which had not been subjected to the sub-micron removal process was observed. FIG. 5A illustrates graphical results of mechanical puncture testing data before and after the process to remove sub-micron flaws according to an exemplary embodiment of the disclosure. FIG. 5B is a schematic side view of a multi-layer 120b having the thin glass cover 128b on a cushion layer 130b used in the mechanical puncture test according to an exemplary embodiment. The thin glass layer 128b was 70 μm thick and disposed on a 6 μm thick layer of pressure-sensitive adhesive (PSA) polymer layer 164 on 125 μm thick layer of Kapton® HN polyimide film 168 on another 6 μm thick layer of PSA 164 on a blank glass substrate 134b. The solid circles in the graph indicate percent loaded to failure of non-treated comparative specimens of thin glass layer 128, 128a, 128b. The squares indicate percent loaded to failure of exemplary specimens having submicron flaws on the surface of the thin glass sheet 128, 128a, 128b removed. The data in FIG. 5A shows the improvement in puncture performance before and after the process to remove sub-micron flaws.

By removing submicron flaws on the second surface 124 of the thin glass sheet 128, 128a, 128b as described for removing submicron flaws on the first surface 122, the thin glass sheet 128, 128a, 128b can withstand surface damage such as scratches and wear from contact during in-service use.

A signal-to-noise ratio (SNR) of a sensor including an overlay can be directly determined by the apparent thickness, $t_{app}$, of the overlay material. The apparent thickness can be defined by the overlay material actual thickness, t, divided by the dielectric constant, k, of the overlay material:

$$t_{app}=t/k$$

The sensor SNR or image quality can be improved by either decreasing the actual thickness of the overlay material or by increasing the dielectric constant. The thickness of the overlay may be determined by the minimum thickness of material needed for sufficient mechanical durability. An ultra-thin cover may reduce the actual thickness distance providing opportunities for higher SNR over conventional overlay systems such as cover glass material systems.

A thin glass overlay according to the embodiment, also provides lower power consumption for sensor devices since such devices need not be driven with a high voltage, which may improve device battery life, for example, and provide faster image detection response times. The treatment process to remove submicron flaws improves durability to provide the thin cover to be used in many applications, including mobile devices, where the underlying sensor stack has a low effective modulus, referred to as compliance or pillow effect.

The ultra-thin cover solution can be thinner than conventional glass, polymer solutions, and may be more durable than polymer based sensors, and cost advantaged over crystal materials, such as sapphire or zirconia.

Accordingly, the glass sheet 128, 128a, 128b of an embodiment can comprise an apparent thickness $t_{app}$ of less than 0.014 mm, where the apparent thickness is the glass sheet thickness t divided by the glass sheet dielectric constant k, $t_{app}=t/k$. The glass sheet 128, 128a, 128b in the multi-layer structure 120, 120a, 120b can also comprise a pencil hardness greater than 6H, where pencil hardness is measured to ASTM D 3363 and ISO 15184 test standards due to the tempering and light etching as described below.

The glass sheet 128, 128a, 128b can be heat tempered and/or chemical tempered. Asymmetric or symmetric chemical strengthened ultra-thin thin glass sheet 128, 128a, 128b can provide a protection or overlay layer for a sensor, such as a light sensor, pressure sensor, distance sensor as may be used over a camera, touch screen, and the like. As thinner cover glass may be desired, the asymmetric chemical strengthening or ion exchange (IOX) strengthening can provide a deeper IOX depth, or depth of layer (DOL) than that achieved with a symmetrical IOX by shifting the central tension towards the first or second tempered surface 122, 124. For example, when the DOL is deeper on the first tempered surface 122, the central tension can be shifted toward the second tempered surface 124. Asymmetrical IOX (AIX) can reduce frangibility for the DOL achieved on the ion-exchanged side having the deeper DOL. As the glass thickness may be less than 50 µm, a deeper DOL can be created in the thin glass with AIX, and hence a higher compressive stress than that which can be achieved by the standard IOX can be achieved with AIX.

Furthermore, an anti-scratch coating, such as aluminum oxide, aluminum nitride, aluminum oxynitride, and the like can be coated on a top surface of the second tempered surface 124 of the AIX cover glass 120, 120a, 120b, that is the ion exchanged surface having a shallower DOL. Similarly, an anti-reflective coating can be coated on the second tempered surface 124 of the AIX cover glass 120, 120a, 120b, as well. In addition, a color filter film stack can be coated on the glass surface for a desirable color.

Figure 6:
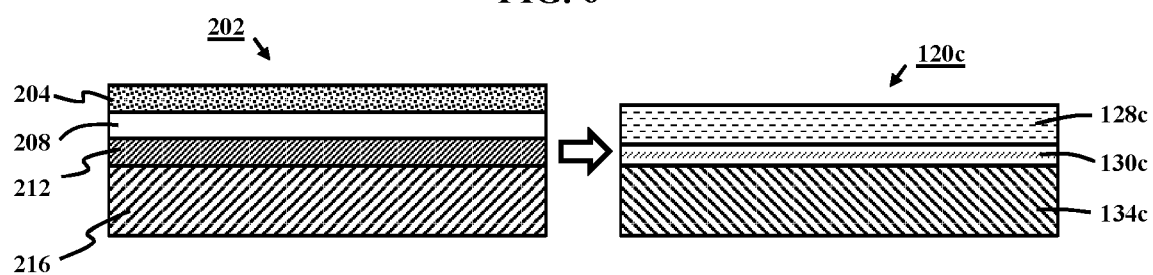
FIG. 6 is a schematic side view of a conventional coating stack that can be replaced by the thin glass cover in a muti-layer according to an exemplary embodiment of the disclosure.

FIG. 6 is a schematic side view of a conventional coating stack 202 that can be replaced by the thin glass multi-layer 120c according to an exemplary embodiment of the disclosure. The conventional coating stack 202 has a hard coating 204 on a color layer 208 on an electrostatic discharge (ESD) protection layer 212 on a glass substrate layer 216. The thin glass multi-layer 120c, which may also be referred to as a cover stack, has a thin glass sheet layer 128c on an adhesive layer 130c on a glass substrate layer 134c. The embodiment can utilize the asymmetric and/or symmetric chemical strengthened ultra-thin glass 128c having a thickness of less than 50 µm as the protection layer to replace the conventional organic and/or inorganic coating stack 202.

Figure 7A:
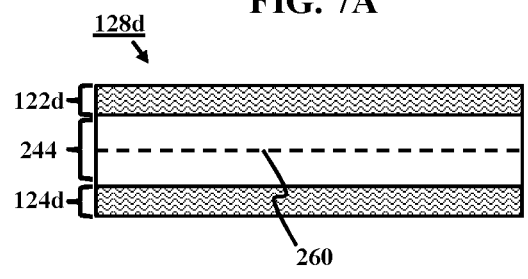
FIG. 7A is a schematic side view of a symmetric chemical strengthen ultra-thin glass cover glass according to an exemplary embodiment of the disclosure.
Figure 7B:
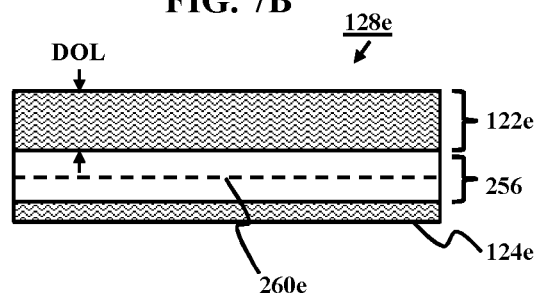
FIG. 7B is a schematic side view of an asymmetric chemical strengthen ultra-thin glass cover glass according to an exemplary embodiment of the disclosure.

FIG. 7A is a schematic side view of a symmetric chemical strengthen ultra-thin glass cover glass 128d according to an exemplary embodiment of the disclosure. FIG. 7B is a schematic side view of an asymmetric chemical strengthen ultra-thin glass cover glass 128e according to an exemplary embodiment of the disclosure. The symmetric chemical strengthen ultra-thin glass cover glass 128d can have a first ion exchanged surface 122d and a second ion exchanged surface 124d each having a compressive layer DOL to the central region 244 where the ion exchange does not reach. The central region 244 thus can have a central tension 260. The asymmetric chemical strengthened ultra-thin glass cover glass 128e has a compressive layer DOL on the first surface 122e such that the non-ion-exchanged region 244e is shifted to toward the opposite surface and the central tension 260e in the AIX ultra-thin glass cover glass 128e is shifted in the same direction. FIGS. 7A and 7B show that AIX can provide a deeper DOL than that achieved with a standard IOX by shifting the central tension 260, 260e towards the second surface 124d, 124e and reduces frangibility for the DOL achieved on the first surface 122d, 122e side.

Figure 8A:
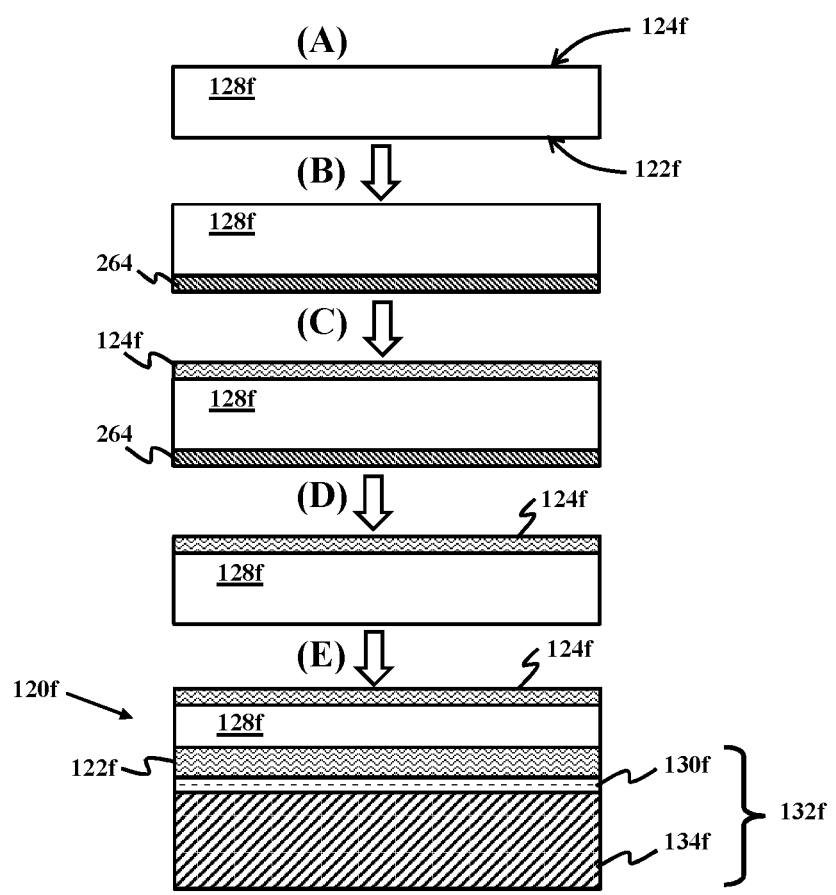
FIGS. 8A, 8B, and 8C are schematic side views illustrating processes to strengthen an ultra-thin cover glass and laminate same to a substrate layer according to an exemplary embodiment.
Figure 8B:
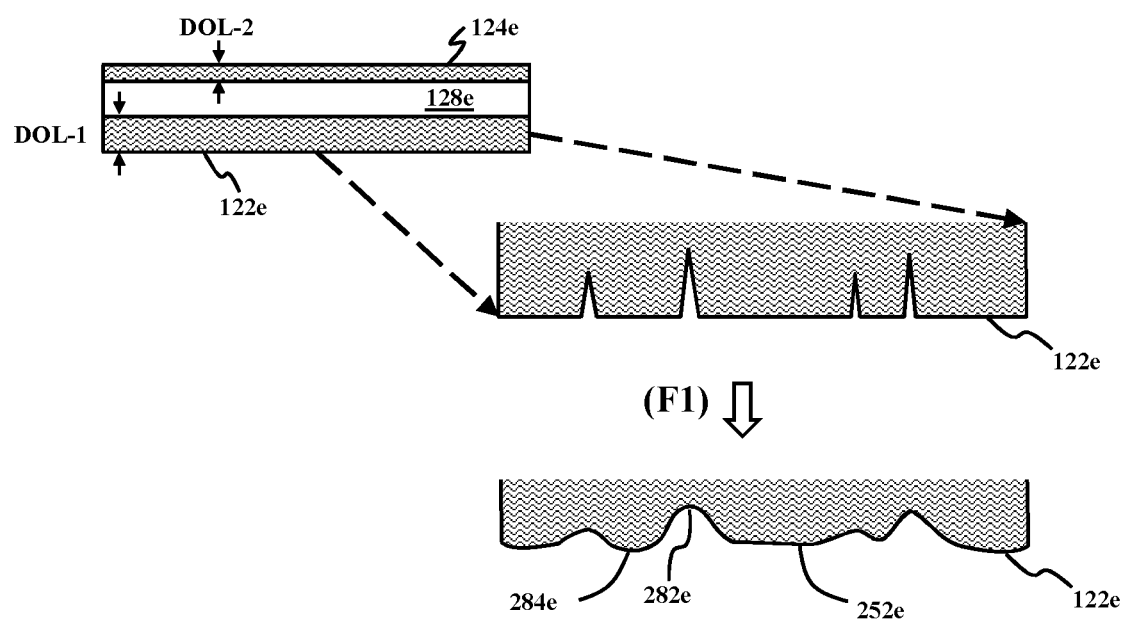

Referring to FIGS. 8A and 8B, an asymmetric chemical strengthening process can be described. FIG. 8A shows a schematic side view of a process to strengthen an ultra-thin cover glass 128f and laminate the cover glass 128f to a substrate layer 134f according to an exemplary embodiment. For example, in operation (A) a 50 µm thick ultra-thin cover glass 128f can be provided, and in operation (B) a thin layer of aluminum 264 (about 50 nm thick), as a protection layer, can be thermally evaporated onto one side of the glass 128f. For example, on the second surface 124f. In operation (C) the aluminum 264 protected glass 128f can be placed in a clamping fixture to slightly bend the glass 128f. This can be done to provide an initial compressive force for the asymmetric ion exchange process. The clamp with glass can be preheated to 410° C. before being placed into a molten potassium nitrate bath. The sample can be left in the bath for about 1.25 hours. It can be removed while still hot and allowed to cool to room temperature. The salt can be rinses off with deionized (DI) water and the aluminum 264 can be removed with aluminum etchant in operation (D). The glass layer 128f having the ion exchange side 124f can be rinsed with DI water and ethanol. Surface stress meter measurement of the second surface 124f can be taken and can indicate a DOL of about 10 µm and a compressive stress of about 200 MPa. In these measurements, a FSM-6000LE™ surface stress meter manufactured by ORIHARA INDUSTRIAL CO., LTD of Japan may be used. The operations (B), (C), and (D) can be repeated to ion exchange the other side of the ultra-thin cover glass 128f, for example, the first surface 122f. Surface stress meter measurement of the first surface 122f can be taken and can indicate a DOL of about 20 µm and a compressive stress of about 770 MPa. The AIX glass 128f can be laminated to an electron device substrate 134f, such as a sensor substrate with a lamination layer 130f. The lamination process can proceed in operation (E) resulting in multi-layer structure 120f. In an example, to test the durability of this asymmetrically ion exchanged glass in a fingerprint sensor application the glass 128f was laminated to the sensor substrate 134f using a UV curable adhesive as the lamination layer 130f. The adhesive was an epoxy/oxetane blend and has an elastic modulus of about 5 GPa. The thickness of the lamination layer 130f was on the order of 10 μm.

Figure 8C:
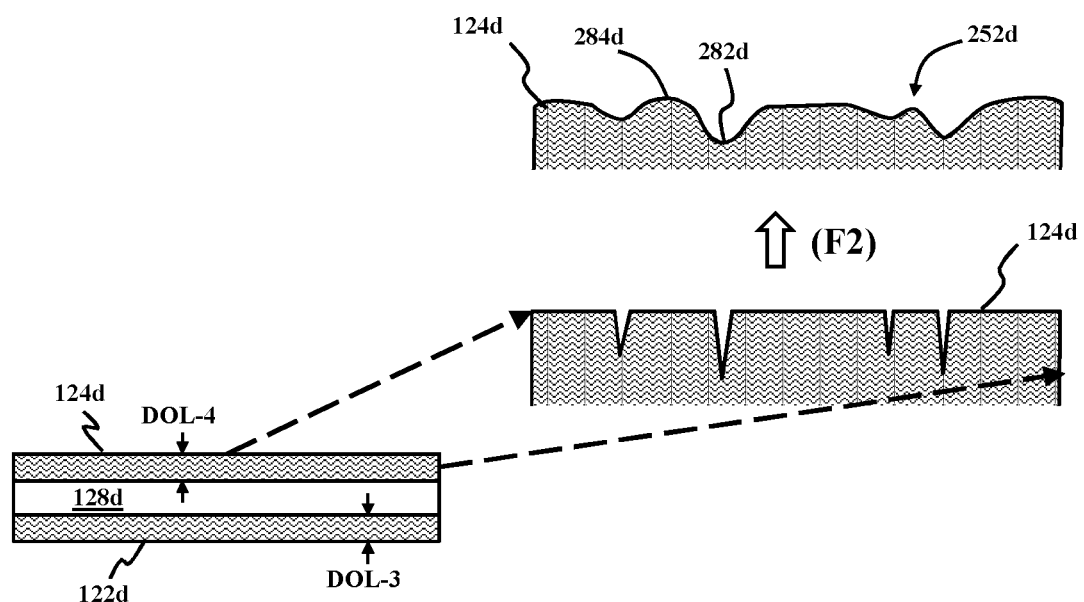

In the embodiment shown in FIG. 8A the AIX glass 128f can be further strengthened by an acid etching (referred to herein as a light etch) to remove small defects in the surface prior to laminating the glass layer 128f to the substrate 134f in operation (E). FIGS. 8B and 8C are schematic side views illustrating a process to strengthen the ultra-thin cover glass 128d, 128e, 128f according to an exemplary embodiment. In operation (F1), (F2) the ion exchanged first surface 122d, 122e, 122f or first and second surfaces 122d, 122e, 122f and 124d, 124e, 124f can be light etched to less than the depth of the compressive layer (DOL) to provide additional strength to the ultra-thin glass layer 128d, 128e, 128f by removing defects and smoothing out sharp features. For example, the light etch may be performed with an acidic solution containing a fluoride compound. For example, not more than a 2 μm thickness of surface glass may be removed by the light etch.

As shown in FIG. 8B, the DOL-1 of the first tempered surface 122e can be greater than the DOL-2 of the second tempered surface 124e. On the other hand, as shown in FIG. 8C, the DOL-3 of the first tempered surface 122d can be substantially the same as the DOL-4 of the second tempered surface 124d.

Another exemplary embodiment discloses a method of manufacturing a multi-layer structure 120, 120a-c, 120f. The method includes ion-exchange tempering (B) at least one major surface 122, 122d-f, 124, 124d-f of a glass sheet 128, 128a-f, light etching (F1), (F2) the at least one major surface 122, 122d-f, 124, 124d-f to remove surface flaws, disposing (E) a laminate layer 130, 130a-c, 130f on one of the at least one tempered and light etched surface 122, 122d-f, 124, 124d-f, and disposing a substrate layer 134, 134a-c, 134f on the laminate layer 130, 130a-c, 130f to laminate the glass sheet 128, 128a-f and the substrate layer 134, 134a-c, 134f together. A puncture factor, Pf, of the glass sheet 128, 128a-f in the multi-layer structure 120, 120a-c, 120f is at least 3000 N/mm$^2$ at B10 ($10^{th}$ percentile of the probability distribution of failure). The puncture factor is the ratio of the puncture load at failure to the thickness t squared of the glass sheet 128, 128a-f, and puncture factor is measured by a 1.5 mm diameter spherical segment tip 308 centered over the at least one major surface 122, 122d-f, 124, 124d-f of the glass sheet 128, 128a-f, and linearly increasing load at a rate of about 30 Newton per second.

Figure 9A:
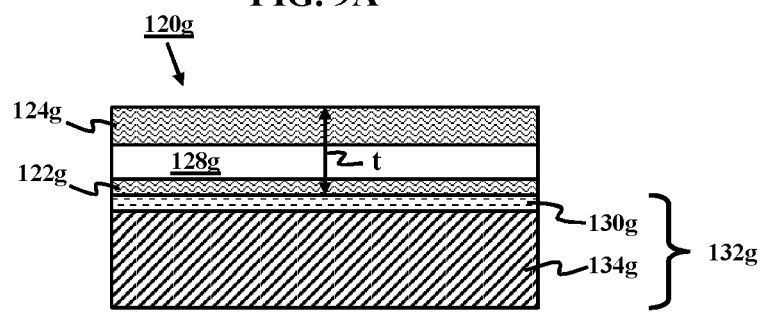
FIG. 9A is a schematic side view of a device comprising a thin glass sheet according to an exemplary embodiment.
Figure 9B:
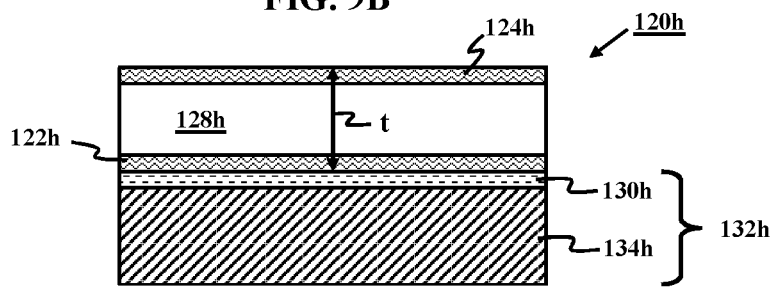
FIG. 9B is a schematic side view of a device comprising a thin glass sheet according to another exemplary embodiment.

FIG. 9A is a schematic side view of a multi-layer device 120g comprising a thin glass sheet 128g according to an exemplary embodiment. As shown in FIG. 9A, the glass layer 128g second tempered surface 124g can have a greater DOL than the first tempered surface 122g DOL, where the first tempered surface 122g is disposed on the lamination layer 130g and the lamination layer 130g is disposed on the substrate layer 134g. FIG. 9B is a schematic side view of a multi-layer device 120h comprising a thin glass sheet 128h according to another exemplary embodiment. In FIG. 9B, the glass layer 128h can have two major surfaces 122h and 124h that were strengthened and have substantially equivalent compressive DOL. The first tempered surface 122h can be disposed on the lamination layer 130h and the lamination layer 130h can be disposed on the substrate layer 134h.

In some embodiments, the first tempered surface 122g DOL can be thinner than the second tempered surface 124g DOL while preferably the first tempered surface 122g DOL can simultaneously have a greater surface compressive stress than the second tempered surface 124g. In some embodiments, the first tempered surface 122h DOL can be substantially the same thickness as the second tempered surface 124h DOL while the first tempered surface 122h can simultaneously have a greater surface compressive stress than the second tempered surface 124h. In some embodiments, the first tempered surface 122e, 122f DOL can be thicker than the second tempered surface 124e, 124f DOL while the first tempered surface 122e, 122f can simultaneously have a greater surface compressive stress than the second tempered surface 124e, 124f. In some embodiments, the second tempered surface 124, 124d-124h may have a greater surface compressive stress than the first tempered surface 122, 122d-122h. Preferably, the first tempered surface 122, 122d-122h has a greater surface compressive stress than the second tempered surface 124, 124d-124h. In some embodiments, the second tempered surface 124, 124d-124h may have substantially the same surface compressive stress as the first tempered surface 122, 122d-122h. In the embodiment, any of the first and second tempered surfaces 122g, 122h, 124g, 124h can be tempered and chemically etched (light etched) less than the depth of the surface compression layer.

Referring to FIGS. 9A and 9B, for example, the glass sheet 128g, 128h can have an apparent thickness, $t_{app}$, of less than 0.014 mm. The apparent thickness refers to the glass sheet 128g, 128h thickness, t, divided by the glass sheet dielectric constant, k: $t_{app}=t/k$. Also, the glass sheet 128g, 128h in the multi-layer structure 120g, 120h can have a pencil hardness greater than 6H, where pencil hardness is measured to ASTM D 3363 and ISO 15184 test standards.

Referring to FIGS. 2, and 7A through 9B, another exemplary embodiment discloses a protective glass system 120, 120f-h. The protective glass system 120, 120f-h can include a glass overlay 128, 128d-h of a glass material and an underlay 132, 132f-h comprising a stack of layers 130, 130f-h, 134, 134f-h, and 138, 138f-h. The glass overlay 128, 128d-h can include a first major surface 122, 122d-h and second major surface 124, 124d-h that face away from one another, and a thickness t of less than 250 micrometers between the first and second major surfaces 122, 122d-h and 124, 124d-h. The glass overlay 128, 128d-h can be strengthened on the first major surface 122, 122d-h, the compressive stress at the first major surface 122, 122d-h can be at least 200 MPa, and the compressive stress can extend inward from the first major surface 122, 122d-h to a depth of layer DOL that can be at least 5 micrometers. For example, the surface compressive stress can be at least 200 MPa, but no greater than 800 MPa, and a depth of layer (DOL) can be in a range between about 5 microns and about 30 microns, for example, the DOL can be in a range between about 10 microns and about 30 microns, or even in a range between about 10 microns and about 20 microns. The glass overlay 128, 128d-h can be an ultra-thin glass, such as a cover glass, a glass sheet and the like. When the glass overlay 128, 128d-h is ultra-thin, for example, less than 70 μm thick or less than 50 μm thick, a DOL of 30 μm may be difficult to achieve, in such instances of ultra-thin glass, the DOL may be up to 20% of the ultra-thin glass sheet thickness instead.

A first layer 130, 130f-h of the underlay 132, 132f-h can be a cushion layer and have a low modulus of elasticity, that being less than 5 GPa, and a second layer 134, 134f-h of the underlay can be stiff, having a modulus of elasticity at least five times the modulus of elasticity of the first layer 130, 130f-h. The first layer 130, 130f-h of the underlay 132, 132f-h can be between the glass overlay 128, 128d-h and the second layer 134, 134f-h of the underlay 132, 132f-h and the first layer 130, 130f-h can have a thickness between the glass overlay 128, 128*d-h* and the second layer 134, 134*f-h* that is 200 micrometers or less, whereby excessive deflection of the glass overlay 128, 128*d-h* into the first layer 130, 130*f-h* of the underlay 132, 132*f-h* can be inhibited by the second layer 134, 134*f-h* of the underlay 132, 132*f-h*.

In the embodiment, the first major surface 122, 122*d-h* of the glass overlay 128, 128*d-h* can have surface features 252*e* indicative of light etching (FIG. 8B). The first major surface 122*e* can have smoothly-rolling pits 282*e* and bumps 284*e* upon 1000× optical microscopy inspection, and most of the pits 282*e* and bumps 284*e* can be submicron in scale, having a depth or height orthogonal to adjoining portions of the first major surface 122*e* that may be less than 1 micrometer.

In the embodiment, a third layer of the underlay 132, 132*f-h* can include electronic componentry comprising electrically conductive pathways 138. The third layer can be positioned between the glass overlay 128, 128*d-h* and the first layer 130, 130*f-h*. The glass 128, 128*d-h* can have an ultra-low apparent thickness $t_{app}$ of 20 micrometers or less, where apparent thickness $t_{app}$ is thickness t divided by dielectric constant, k, of the glass material, thereby benefitting signal-to-noise performance for communication of information through the glass overlay 128, 128*d-h* to the electronic componentry 138. The protective glass system 120, 120*f-h* can have a puncture factor, Pf, of at least 3000 N/mm$^2$ at B10 (10$^{th}$ percentile of the probability distribution of failure), wherein puncture factor is measured by a 1.5 mm diameter spherical segment tip 308 centered over the second major surface 124, 124*d-h* of the glass overlay 128, 128*d-h*, and linearly increasing load at a rate of about 30 Newton per second.

In some of these embodiments, the glass material can be borosilicate glass.

In the embodiment, the glass overlay can have an average blunt impact contact energy of about 190 mJ and a 10$^{th}$ percentile (B10) of a probability distribution blunt impact contact energy of greater than 120 mJ, wherein the blunt impact contact energy is measured by dropping a 28 gram, 19.02 mm diameter ball directly on the glass overlay in the protective glass system. The average energy of 200 mJ is much higher than the "typical" requirement of 50 mJ (25 g ball at 20 cm) for sensor cover applications. The blunt impact testing was done by dropping a 28 g ball on the protective cover glass in the multi-layer stack structure integrated in a simulated sensor cover.

The simulated sensor with exposed overlay can encounter blunt impact damage due to fall events or contact with blunt objects. In order to measure the survivability of these events, ball drop testing was carried out. A fixture was used to conduct ball drop testing. Based on in-service use, the overlay glass may need to survive as high as 50 mJ of impact energy.

The test sample was assembled on a simulated sensor and then mounted on a stainless-steel plate with a 0.3 mm shock pad. A 28 g ball was dropped starting at 5 cm and the drop height was increased sequentially 5 cm until the overlay glass was fractured. Ten samples were tested. All tested samples survived well above 50 mJ of energy. The failure energy ranged from 96 mJ to 265 mJ. The 10$^{th}$ percentile failure energy was also well above the normal requirement of 50 mJ (B10: 128 mJ).

Figure 10:
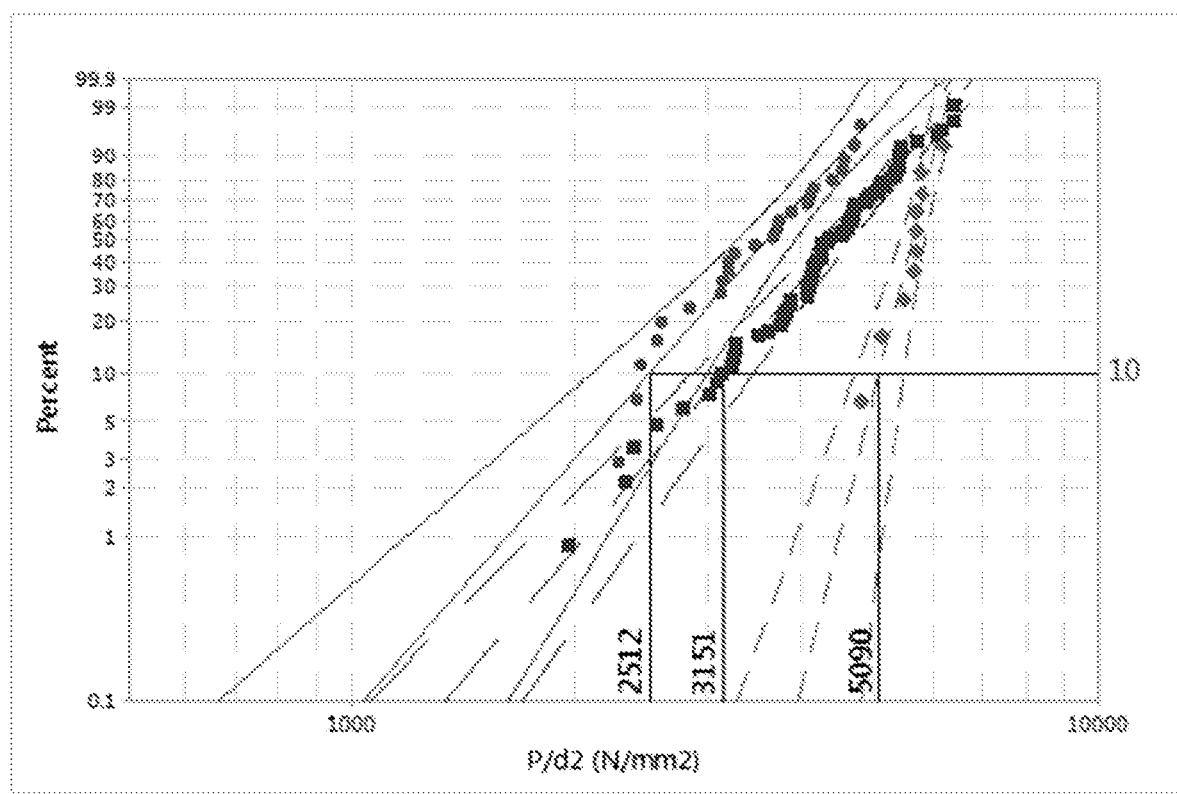
FIG. 10 is a graph of the failure energy of the overlay glass comparing the overlay glass subjected to tempering and light etching process according to exemplary embodiments of the disclosure to overlay glass without the light etching process.

FIG. 10 is a graph of the failure energy of the overlay glass having the tempering and light etching process as described herein indicated by solid squares and solid diamonds for two different experimental exemplary embodiments. The failure energy of the overlay glass without the light etching process is indicated in FIG. 10 by solid circles.

The B10 value of P/d$^2$ for the tempered and light etched specimens was greater than 3000 N/mm$^2$ and the B10 value of P/d$^2$ for the non-etched specimens was less than 3000 N/mm$^2$ as shown in the graph of FIG. 10. The statistics of the FIG. 10 plotted data obtained are presented in Table 4.

| Table of Statistics | | | | |
|---|---|---|---|---|
| Shape | Scale | AD* | F | C |
| 5.2891 | 3843.75 | 0.832 | 24 | 0 |
| 5.4468 | 4763.02 | 0.596 | 77 | 0 |
| 18.5695 | 5746.15 | 1.748 | 10 | 0 |

Figure 11:
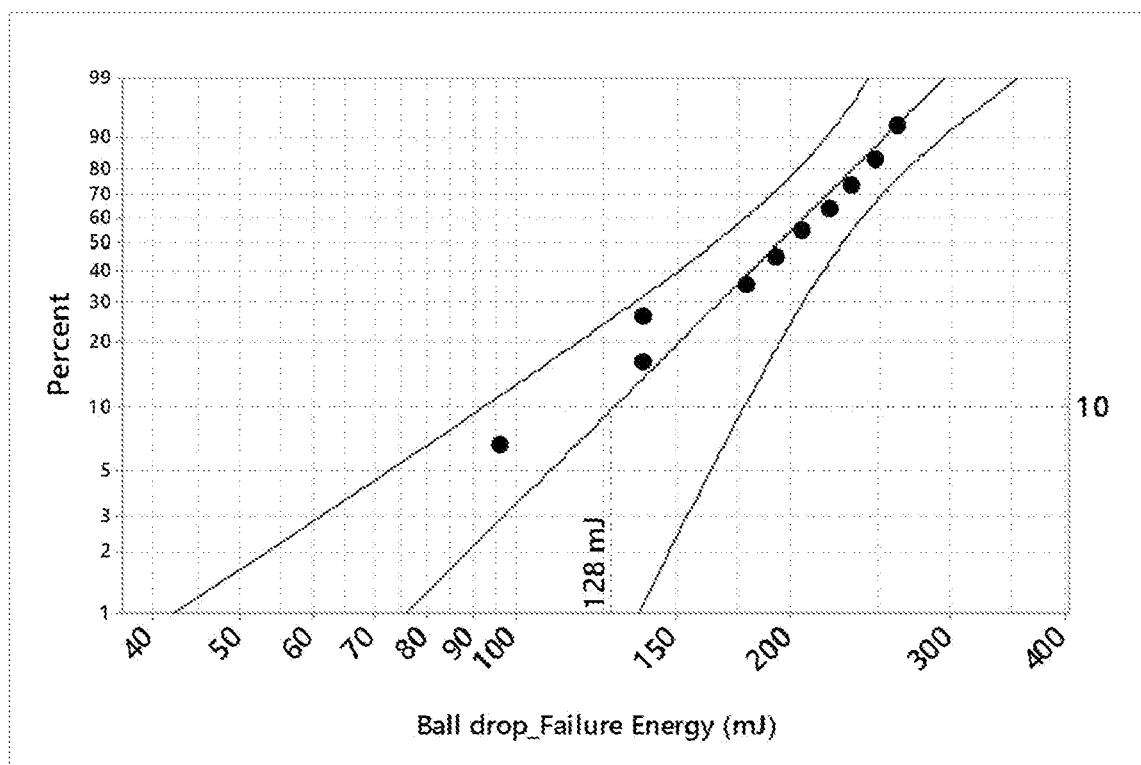
FIG. 11 is a graph of the probability of failure energy for the ball drop test of a 28 g ball having a 19.02 mm diameter according to exemplary embodiments of the disclosure.

FIG. 11 is a graph of the probability of failure energy in milli-Joules (mJ) for the ball drop test of a 28 g ball having a 19.02 mm diameter. The 95% Weibull confidence interval is indicated showing a B10 of 128 mJ. The statistics of the FIG. 11 plotted data obtained are presented in Table 5.

TABLE 5

| Table of Statistics | |
|---|---|
| Shape | 4.51684 |
| Scale | 209.984 |
| Mean | 191.667 |
| StDev | 48.1615 |
| Median | 193.618 |
| IQR | 66.3665 |
| Failure | 10 |
| Censor | 0 |
| AD* | 1.451 |

Figure 12:
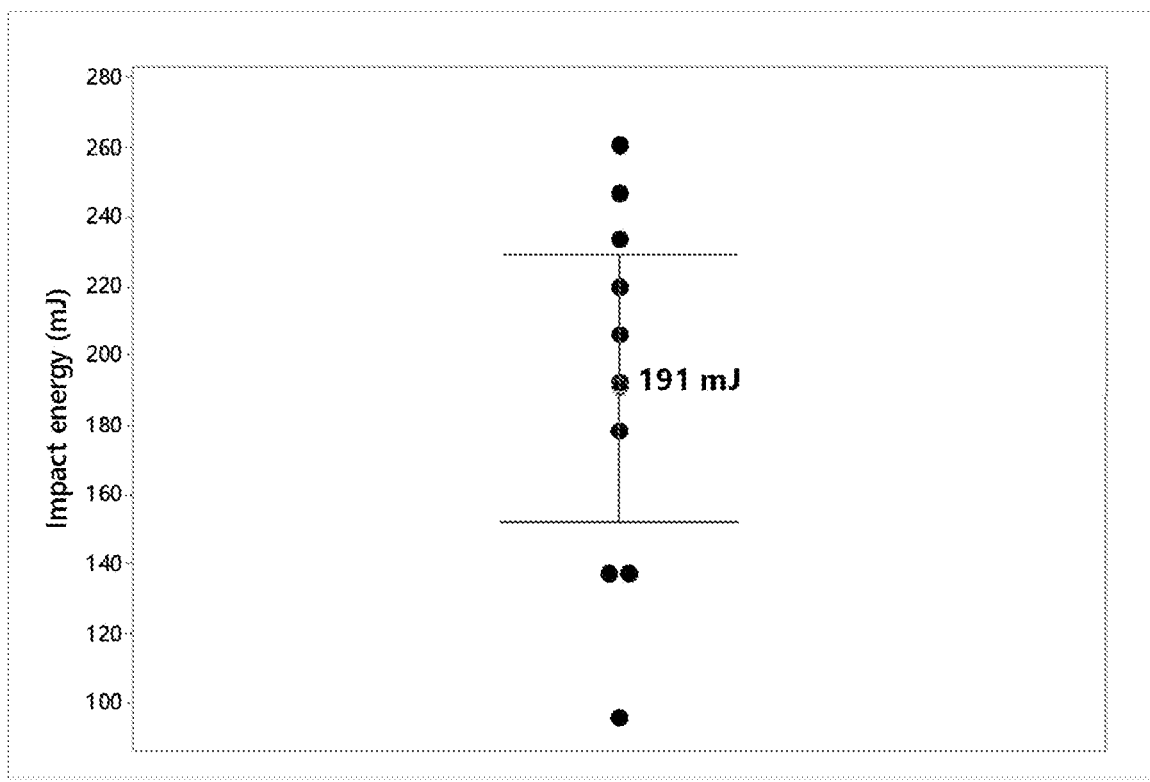
FIG. 12 is a graph of the protective glass overlay impact energy in mJ for the 95% confidence interval for the mean for the ball drop test of a 28 g ball having a 19.02 mm diameter according to exemplary embodiments of the disclosure.

FIG. 12 is a graph of the protective glass overlay impact energy in mJ for the 95% confidence interval for the mean for the ball drop test of a 28 g ball having a 19.02 mm diameter. The 95% confidence interval extends from about 160 mJ to about 230 mJ with a mean of 191 mJ.

Figure 13:
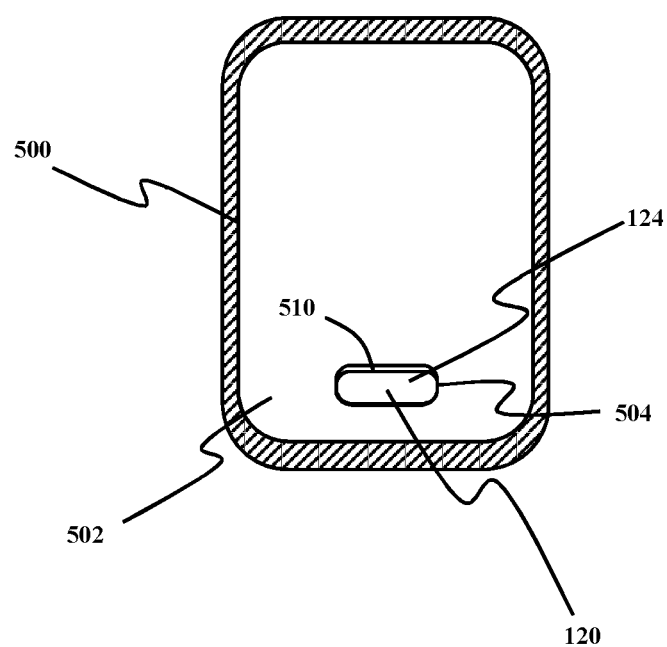
FIG. 13 is a schematic front face view of a mobile device that includes the protective glass system, where the glass overlay of the protective glass system is strengthened on the first and second major surfaces according to exemplary embodiments of the disclosure.

According to some embodiments of the disclosure, as shown in FIG. 13, a mobile device 500 may include the protective glass system 120, 120*a-c*, 120*f-h*, where the glass overlay 128, 128*a-h* is strengthened on the second major surface 124, 124*a*, 124*d-h*. The compressive stress at the second major surface 124, 124*a*, 124*d-h* may be at least 200 MPa. The compressive stress may extend inward from the second major surface 124, 124*a*, 124*d-h* to a depth of layer (DOL) that is at least 10 micrometers. The compressive stress may extend inward from the second major surface 124, 124*a*, 124*d-h* to a depth of layer that is less than, greater than, or substantially the same as the depth of layer that the compressive stress extends inward from the first major surface 122, 122*a*, 122*d-h* as previously described. As shown in FIG. 13, in the mobile device 500, the second major surface 124, 124*a*, 124*d-h* may be exposed through an opening 504 in a display cover surface 502 of the mobile device 500. The second major surface can be recessed by about 100 to 1200 micrometers from the display cover surface indicated by recess step 510 in FIG. 13.

Figure 14A:
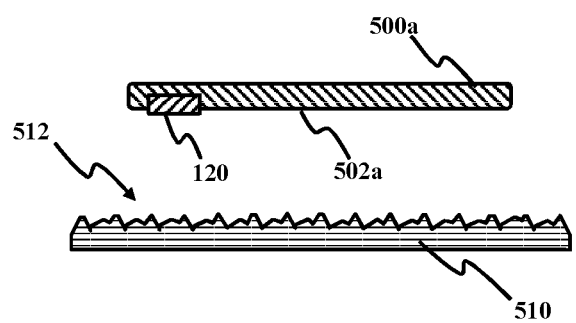
FIGS. 14A, 14B, and 14C are schematic diagrams illustrating a breakage resistance test according to exemplary embodiments of the disclosure.
Figure 14B:
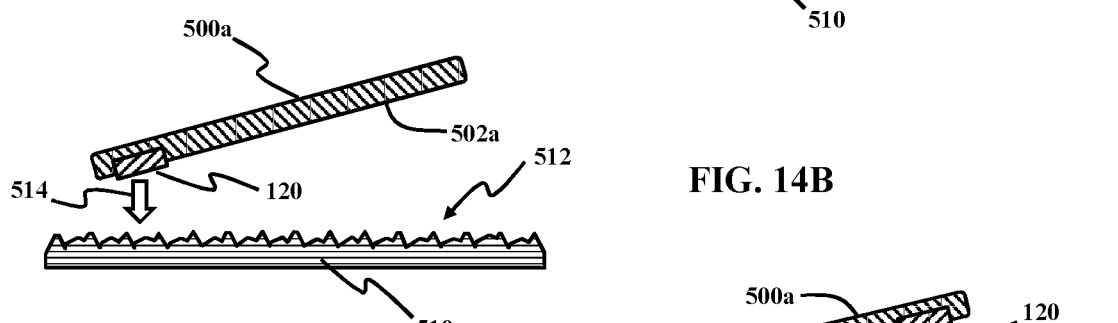
Figure 14C:
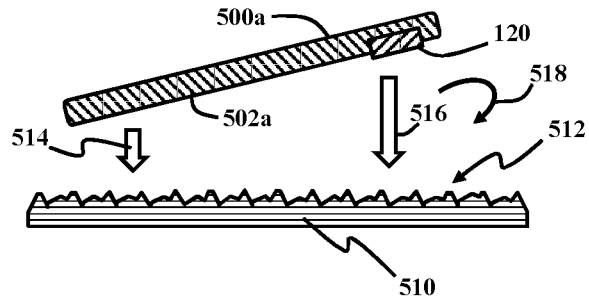

According to some embodiments of the disclosure, the glass overlay 128, 128*a-h* in the protective glass system 120, 120*a-c*, 120*f-h* of the mobile device 500 may have a drop breakage resistance of greater than 1.5 m. Referring to FIGS. 14A, 14B, and 14C, the breakage resistance can be measured by dropping the mobile device 500 of about 130 g, display cover surface 502 first, onto a substantially non-yielding surface covered by sandpaper 510 of 180 grit Al$_2$O$_3$ particles 512 embedded in glue in a flat face orientation to the sandpaper and then in 30 degree angle orientations to the sandpaper.

The device 500 drop test may simulate in-service failures due to sharp contact damage of the glass overlay 128, 128a-h for drop events on various real world rough surfaces such as granite, asphalt and the like. The topography and sharpness of 180 grit sand paper 510 ($Al_2O_3$ particles 512 embedded on a glue matrix) may closely mimic real world rough surfaces. Using 180 grit sandpaper 510, controlled test data was generated with good repeatability. The sand paper 510 was changed every test sample enabling consistency.

The glass overlay 128, 128a-h in the protective glass system 120, 120a-c, 120f-h of the mobile device 500 was integrated in the cover glass 502a and assembled in a test puck 500a simulating an electronic mobile device 500 such as a phone. The test puck 500a has a similar flexure to actual mobile phone and similar weight of about 130 g. The overlay glass 128, 128a-h was recessed by about 200 µm from the mobile device cover glass 502a.

The samples of interest were tested in three "independent test" configurations (i) flat face drop (FIG. 14A), where test sample 500a comes in contact full face on the 180 grit rough surface (ii) 30 degree angle drop, where the tested sample 500a comes in contact at an angle with a flexure/bending event on the 180 grit rough surface, with the puck oriented such that sensor glass 128, 128a-h takes the first hit 514 (FIG. 14B), and (iii) 30 degree angle drop, where the tested sample 500a comes in contact at an angle with a flexure/bending event on the 180 grit rough surface, with the puck oriented such that sensor glass 128, 128a-h takes the second hit 516 (FIG. 14C), which is more severe than the orientation taking the first hit 514 perhaps due to an accelerated rotation 518. The test sample 500a on a mobile device, was mounted on a commercially available drop test machine (YOSHIDA SEIKI DROP TESTER, MODEL-DT-205H, manufactured by SHINYEI TECHNOLOGY CO, Japan) (i) aligned flat to the 180 grit drop surface and (ii) aligned at 30 degree angle to the 180 grit drop surface with the protective glass system 120, at two different ends of the mobile device 500a. The drop height was sequentially increased by 10 centimeter increments from a start height of 22 centimeters to a maximum height of 220 cm. The test samples were inspected after each drop for fracture of the sensor overlay glass. Even when the mobile device 500a cover glass 502a fails first, the test was continued to verify whether the sensor cover glass 128, 128a-h breaks. About five samples per condition and per orientation were tested. In all three orientations, no fracture was observed in the sensor overlay glass 128, 128a-h. The mobile device cover glass 502a fractured before the sensor overlay glass 128, 128a-h.

According to some embodiments herein, the glass overlay 128, 128a-h second major surface 124, 124a, 124d-h in the mobile device 500, 500a may have a tumble resistance of greater than 45 minutes. A tumble resistance can be measured by tumbling the mobile device 500, 500a with house keys, coins, cosmetic cases, and emery boards, waiting 12 hours after stopping the tumbling and microscopically examining the second major surface 124, 124a, 124d-h for any glass fracture. It has been determined by Applicant that 45 minutes of such tumbling can be about equivalent to one year of in-service cumulative damage.

The exposed surface 124, 124a, 124d-h of the glass overlay 128, 128a-h integrated in an electronic mobile device 500, 500a may be subjected to scratch events in-service, as a user may carry the device 500, 500a in a purse or pocket. The glass overlay 128, 128a-h may need to be durable to survive such service damage events without fracture. Presence of micro-ductile scratches and lateral scratches can weaken the glass 128, 128a-h strength as well as impact visual appearance.

Figure 15A:
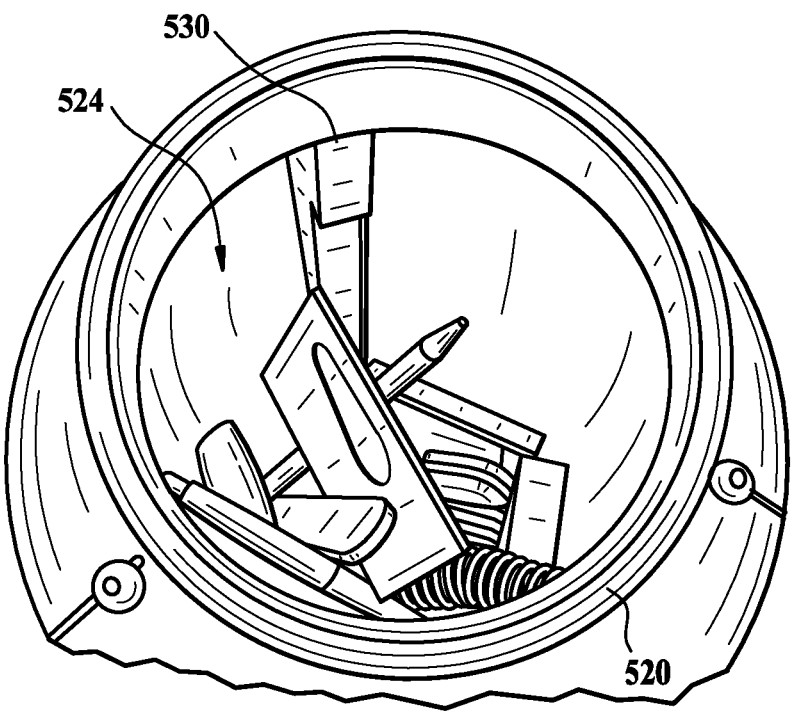
FIGS. 15A and 15B are schematics of a tumble test to accelerate and replicate field scratch events the protective glass overlay mounted in a simulated mobile electronic device according to exemplary embodiments of the disclosure.
Figure 15B:
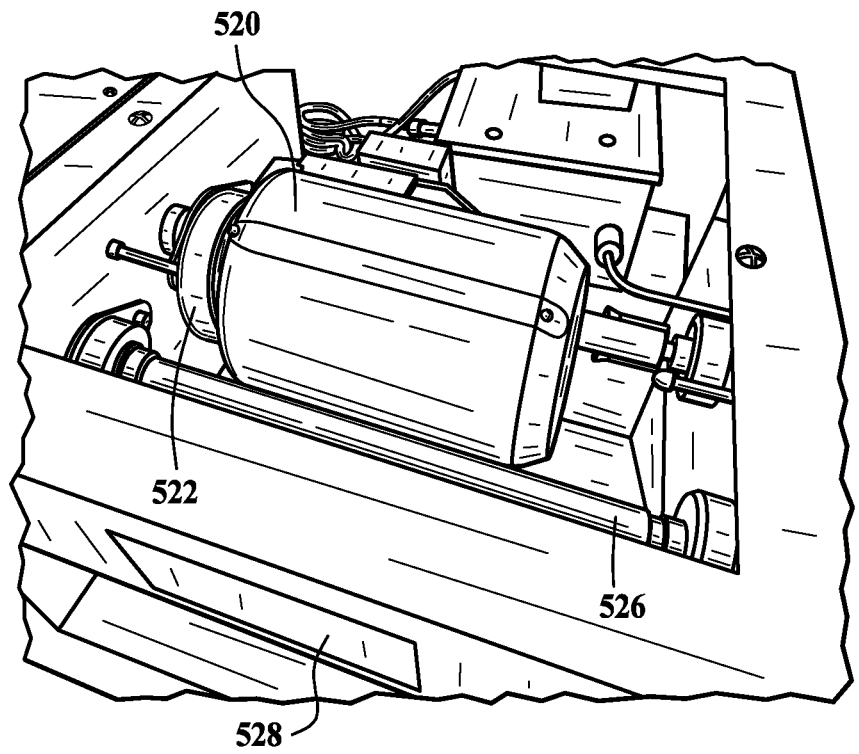

A test fixture was designed to test the glass overlay 128, 128a-h. The fixture was designed such that the glass overlay 128, 128a-h can be aligned flush with the mobile device 500, 500a cover glass 502, 502a or recessed by a step 510 from the cover glass 502, 502a or even proud from the cover glass 502, 502a (not shown). Typically, the overlay 128, 128a-h insert may be in recess or flush with respect to the mobile device 500 500a cover glass 502, 502a. To create accelerated time damage and to replicate field scratch events the overlay 128, 128a-h mounted in the fixture 500, 500a was tumbled for 45 minutes which may be roughly equivalent to more than one year worth of cumulative damage in the field. The tumbler contained common items that may be found encountered by the overlay 128, 128a-h in a user's pocket or purse (for example, house keys, pens, coins, cosmetics, badges, and emery board). A one gallon NALGENE™ container 520 with screw top lid 522 as shown in FIGS. 15A and 15B was filled with the purse contents common items 524 and the overlay 128, 128a-h mounted in the fixture 500, 500a (Sample). The Nalgene container 520 with the contents and the Sample was placed on rotating cylinders 526 of a tumble tester 528. The tumble tester 528 used was a COVINGTON_ROLL_N_TUMBLE MODEL #268 with ⅓ HP motor, manufactured by COVINGTON ENGINEERING (Redlands, Calif.). The testing was performed at 40 RPM. Fins 530 attached to the inner diameter of the NALGENE™ container 520 provided mixing of container contents as the container 520 rotated on the tumble tester 528. After 45 minutes of tumbling and 12 hour wait period, the sample was inspected visually and under microscope for visual appearance and for any damage such as scratches and glass fracture visually and microscopically. The 12 hour wait period is to detect any delayed fractures of the glass overlay 128, 128a-h.

The test results indicated the glass overlay 128, 128a-h survived 45 minutes of tumbling without fracture and no surface damage seen "visually". Micro-ductile scratches which may not typically be seen by the naked eye may be seen only under high magnification (30×).

The micro-ductile scratches were also analyzed by confocal microscopy. The most severe scratches on the overlay glass 128, 128a-h were found to be only about 0.5 µm deep and only about 10 µm wide. In comparison, the surface damage on a soda lime glass of similar area after 45 minutes tumbling was visibly damaged with lateral scratches and a scratch depth of about 8 µm and scratch width of about 200 µm.

EXEMPLARY AND COMPARATIVE
EXAMPLES

The normalized loads, defined as $P/d^2$, where P is the puncture load at failure while d is the thickness of the ultrathin overlay are shown in the Table 1 below for two prior art references. Chai and Lawn (2000) used an abraded glass in the work in Ref. 1. In a prior publication studying the mechanics of a different structure Chai and Lawn (1999) used etched glass, which is stronger than abraded glass in Ref. 2. Applying the strength of etched glass to the formulation defined in Chai and Lawn (2000) defines the prior art as $P/d^2 < 2000$ $N/mm^2$.

TABLE 1

|  | h (mm) | d (mm) | P (Newtons) | P/d² (N/mm²) |
|---|---|---|---|---|
| Ref 1 | 0.1 | 0.08 | 4 | 625 |
|  | 0.1 | 0.136 | 10.25 | 554 |
|  | 0.1 | 0.215 | 23.37 | 506 |
| Ref 2 | 0.03 | 0.1 | 16 | 1600 |
|  | 0.03 | 0.3 | 100 | 1111 |

In exemplary experiments listed in the following Table 2, for sensor cover applications where the sensor becomes part of the outer enclosure of the device, for a P/d² of 1500 N/mm², the prior art requires a 0.125 mm thick glass, whereas according to exemplary embodiments of the present disclosure, only a 0.07 mm thick glass would be required. This 45% reduction in thickness can have a large impact on the signal to noise ratio of the sensor.

The ultra-thin overlay for the examples, were prepared by cutting the part to the final shape, etching the glass to remove all prior flaws, strengthening the ultra-thin glass by ion-exchange, followed by light etching a second time to remove any new flaws created during the ion-exchange process and protecting the reduced-flaw surface with a protective layer, where the protective layer was the laminate layer. Herein, the light etching is a light chemical etch that removes material to a depth of less than the ion-exchange depth of layer (DOL).

TABLE 2

| Examples | Thickness (mm) | no light etch P/d² (N/mm²) | light etch P/d² (N/mm²) |
|---|---|---|---|
| C-1 | 0.090 | 1815 |  |
| C-2 | 0.095 | 2411 |  |
| C-3 | 0.081 | 2057 |  |
| C-4 | 0.111 | 1734 |  |
| C-5 | 0.148 | 2237 |  |
| C-6 | 0.218 | 2128 |  |
| C-7 | 0.222 | 1392 |  |
| Ex-1 | 0.087 |  | 3794 |
| Ex-2 | 0.088 |  | 4163 |
| Ex-3 | 0.070 |  | 5180 |
| Ex-4 | 0.123 |  | 2390 |
| Ex-5 | 0.139 |  | 3809 |
| Ex-6 | 0.087 |  | 3612 |
| Ex-7 | 0.081 |  | 3824 |
| Ex-8 | 0.081 |  | 3898 |

The light etch treatment (thin etch) in exemplary embodiment samples Ex1 through Ex-8 showed a P/d² greater than 3000 N/mm² at B10 (10$^{th}$ percentile of the probability distribution of failure) while without treatment, in the comparative samples C-1 through C-7, P/d² was lower than 3000 N/mm².

A lower thickness of the overlay enables a lower apparent thickness. The following Table 3 lists various materials and thicknesses conventionally used. The present exemplary embodiments disclosed herein enable the lowest apparent thickness.

TABLE 3

| Material | Thickness (μm) | Dielectric constant | Apparent thickness (μm) |
|---|---|---|---|
| LeTV phone | Glass | 0.175 | 7.2 | 0.024 |
| iPhone | Sapphire | 0.25 | 11.2 | 0.022 |
| Galaxy 5 | Polymer | 0.075 | 3.5 | 0.021 |
| Galaxy 6 | Polymer | 0.6 | 3.5 | 0.171 |
| Present Exemplary Embodiments | Glass | 0.1 | 7.2 | 0.014 |

The pencil hardness tests were conducted with the glass layer 128, 128a-h laminated in the multi-layer samples. The process for pencil hardness was as follows. A pencil hardness tester PH5800 from BYK GARDNER® was used with matching pencil set (9B to 9H) for testing. The coating was coated and cured on glass plate samples of different sizes and shapes, some glass was pre-treated with different chemicals to mimic the substrates of different applications. This particular tester has a level gauge and specific weight that meet the requirements of ASTM D 3363 and ISO 15184 test standards. The samples were placed flat on a desk and the tester with specific pencil hardness was put into place that when pencil tip touched the sample the level gauge indicated a flat condition. The tester with wheel was then push forward so that the pencil could move across a distance of at least half an inch. The highest hardness rating pencil that did not create a visible scratch line on the surface was assigned as the pencil hardness of the sample. The results showed that the laminated samples pass 9H pencil hardness without any observable scratch.

According to exemplary embodiments of the disclosure, the strengthened glass cover can replace the organic/inorganic coating stack to provide a better surface protection as well as reduce the glass thickness to less than 50 μm, which provides sensor performance improvement measured in terms of signal-to-noise ratio by greater than 20 dB while providing a better scratch and impact resistance as opposed to organic coating stack.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A multi-layer structure, comprising:
    a glass sheet less than 250 micrometers thick, the glass sheet comprising first and second tempered surfaces, wherein at least the first tempered surface incorporates a surface compression layer having a depth of at least 5 micrometers and a surface compressive stress of at least 200 MPa;
    an adhesive lamination layer disposed on the first tempered surface; and
    a substrate layer, wherein the substrate layer comprises a modulus of elasticity of greater than 25 GPa,
    wherein the glass sheet and the substrate layer are laminated together via the adhesive lamination layer, and
    wherein a puncture factor, Pf, of the glass sheet in the multi-layer structure is at least 3000 N/mm² at B10 (10$^{th}$ percentile of the probability distribution of failure), wherein the puncture factor is the ratio of the puncture load at failure to the thickness squared of the glass sheet, wherein puncture factor is measured by a 1.5 mm diameter spherical segment tip centered over the at least one tempered surface of the glass sheet, and linearly increasing load at a rate of about 30 Newton per second.

2. The structure of claim 1, wherein the lamination layer comprises a modulus of elasticity less than 9 GPa, and wherein the adhesive lamination layer is less than 20 µm thick.

3. The structure of claim 1, further comprising an electronic componentry layer comprising electrically conductive pathways disposed between the glass sheet and the substrate layer.

4. The structure of claim 1, wherein the adhesive lamination layer is optically clear.

5. The structure of claim 1, wherein the second tempered surface incorporates a surface compression layer having a depth of at least 10 micrometers and a surface compressive stress of at least 200 MPa, wherein the second tempered surface compression layer depth is less than the first tempered surface compression layer depth.

6. The structure of claim 5, wherein the second tempered surface is tempered and chemically etched less than the depth of the surface compression layer.

7. The structure of claim 1, wherein the first tempered surface is tempered and chemically etched less than the depth of the surface compression layer.

8. The structure of claim 1, wherein the glass sheet comprises an apparent thickness, $t_{app}$, of less than 0.014 mm, wherein apparent thickness refers to the glass sheet thickness, t, divided by the glass sheet dielectric constant, k: $t_{app}=t/k$, and
wherein the glass sheet in the multi-layer structure comprises a pencil hardness greater than 6H, wherein pencil hardness is measured to ASTM D 3363 and ISO 15184 test standards.

9. A protective glass system, comprising:
a glass overlay of a glass material, the glass overlay comprising:
first and second major surfaces that face away from one another, and
a thickness of less than 250 micrometers between the first and second major surfaces,
wherein the glass overlay is strengthened on at least the first major surface,
wherein compressive stress at the first major surface is at least 200 MPa, and
wherein the compressive stress extends inward from the first major surface to a depth of layer that is at least 5 micrometers; and
an underlay comprising a stack of layers,
wherein a first adhesive layer of the underlay has a low modulus of elasticity, that being less than 5 GPa, to cushion the glass overlay, and wherein the first adhesive layer is less than 20 µm thick,
wherein a second layer of the underlay is stiff, having a modulus of elasticity of greater than 25 GPa,
wherein the glass overlay and the second layer of the underlay are laminated together via the first adhesive layer, and
wherein the first adhesive layer has a thickness between the glass overlay and the second layer that is 200 micrometers or less, whereby deflection of the glass overlay into the first adhesive layer of the underlay is inhibited by the second layer of the underlay, and
wherein a puncture factor, Pf, of the glass overlay in the multi-layer structure is at least 3000 N/mm² at B10 ($10^{th}$ percentile of the probability distribution of failure), wherein the puncture factor is the ratio of the puncture load at failure to the thickness squared of the glass overlay, wherein puncture factor is measured by a 1.5 mm diameter spherical segment tip centered over the at least one tempered surface of the glass overlay, and linearly increasing load at a rate of about 30 Newton per second.

10. The glass system of claim 9, wherein the first major surface of the glass overlay comprises surface features indicative of etching.

11. The glass system of claim 10, wherein the first major surface comprises smoothly-rolling pits and bumps upon 1000× optical microscopy inspection, and
wherein most of the pits and bumps are submicron in scale, having a depth or height orthogonal to adjoining portions of the first major surface that is less than 1 micrometer.

12. The glass system of claim 9, wherein a third layer of the underlay includes electronic componentry comprising electrically conductive pathways.

13. The glass system of claim 12, wherein the third layer is positioned between the glass overlay and the first adhesive layer.

14. The glass system of claim 9, wherein the glass overlay has an ultra-low apparent thickness $t_{app}$ of 20 micrometers or less, where apparent thickness $t_{app}$ is thickness t divided by dielectric constant, k, of the glass material.

15. The glass system of claim 9, wherein the glass material comprises borosilicate glass.

16. The glass system of claim 9, wherein the glass overlay comprises an average blunt impact contact energy of about 190 mJ and a $10^{th}$ percentile (B10) of a probability distribution blunt impact contact energy of greater than 120 mJ, wherein the blunt impact contact energy is measured by dropping a 28 gram, 19.02 mm diameter ball directly on the glass overlay in the protective glass system.

17. A mobile device comprising the glass system of claim 9, wherein the glass overlay is strengthened on the second major surface,
wherein compressive stress at the second major surface is at least 200 MPa,
wherein the compressive stress extends inward from the second major surface to a depth of layer that is at least 10 micrometers, and
wherein the compressive stress extends inward from the second major surface to a depth of layer that is less than the depth of layer that the compressive stress extends inward from the first major surface,
wherein the second major surface is exposed through an opening in a display cover surface of the mobile device, and
wherein the second major surface is recessed by about 100 to 1200 micrometers from the display cover surface.

18. The mobile device of claim 17, wherein the glass overlay comprises a breakage resistance of greater than 1.5 m,
wherein breakage resistance is measured by dropping the mobile device of about 130 g display cover surface first onto a substantially non-yielding surface covered by 180 grit $Al_2O_3$ embedded in glue sandpaper in a flat face orientation to the sandpaper and then in a 30 degree angle orientation to the sandpaper.

19. The mobile device of claim 17, wherein the glass overlay second major surface comprises a tumble resistance of greater than 45 minutes,
wherein tumble resistance is measured by tumbling the mobile device with house keys, coins, cosmetic cases, and emery boards, waiting 12 hours after stopping the tumbling and microscopically examining the second major surface for any glass fracture,
wherein 45 minutes is about equivalent to one year of in-service cumulative damage.

\* \* \* \* \*